(12) United States Patent
Brucker et al.

(10) Patent No.: US 7,297,422 B2
(45) Date of Patent: Nov. 20, 2007

(54) METHOD FOR SPUTTERING MAGNETIC RECORDING MEDIA

(75) Inventors: Charles Fredrick Brucker, Pleasanton, CA (US); Jean Ling Lee, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 158 days.

(21) Appl. No.: 10/741,549

(22) Filed: Dec. 19, 2003

(65) Prior Publication Data

US 2005/0136290 A1    Jun. 23, 2005

(51) Int. Cl.
G11B 5/66 (2006.01)
G11B 5/70 (2006.01)

(52) U.S. Cl. .................... 428/832; 428/831.2
(58) Field of Classification Search ............... 428/831, 428/831.2, 836, 832
See application file for complete search history.

(56) References Cited

U.S. PATENT DOCUMENTS

| | | | |
|---|---|---|---|
| 4,414,087 A | 11/1983 | Meckel | 204/192 M |
| 4,441,974 A | 4/1984 | Nishikawa et al. | 204/192 R |
| 4,487,675 A | 12/1984 | Meckel | 204/192 M |
| 4,626,336 A | 12/1986 | Bloomquist et al. | 204/298 |
| 4,834,855 A | 5/1989 | Bloomquist et al. | 204/192.15 |
| 5,891,311 A | 4/1999 | Lewis et al. | 204/192.12 |
| 6,328,856 B1 | 12/2001 | Brucker | 204/192.12 |
| 6,461,750 B1 | 10/2002 | Chen et al. | 428/694 |
| 6,689,413 B2* | 2/2004 | Liu et al. | 427/131 |
| 6,936,353 B1* | 8/2005 | Wu et al. | 428/611 |
| 2003/0039863 A1 | 2/2003 | Chen et al. | 428/684 |
| 2003/0108776 A1 | 6/2003 | Chang et al. | 428/694 |

OTHER PUBLICATIONS

Manville, B.B., et al.; "Miscut-angle dependence of perpendicular magnetic anisotropy in thin epitaxial $CoPt_3$ films grown on vicinal MgO," Applied Physica Letters, vol. 81, No. 3, Jul. 15, 2002, pp. 517-519

* cited by examiner

Primary Examiner—Holly Rickman
(74) Attorney, Agent, or Firm—Darby & Darby, P.C.

(57) ABSTRACT

Generally, methods and apparatus are disclosed for fabrication of angle-of-incidence layers on a substrate. In one embodiment, the angle-of-incidence layers may have either radial or circumferential tilt symmetry, using, for example, sputtering or evaporation techniques. In one example, an apparatus for sputtering material comprises a substrate support member, a cathode positioned in substantially facing relationship with respect to the substrate support member and a shutter plate. The shutter plate is disposed between the substrate support member and the cathode and defining an aperture for selective transmission of sputtered articles from the cathode on the basis of a non-perpendicular trajectory angle relative to a plane of the substrate support member.

14 Claims, 14 Drawing Sheets

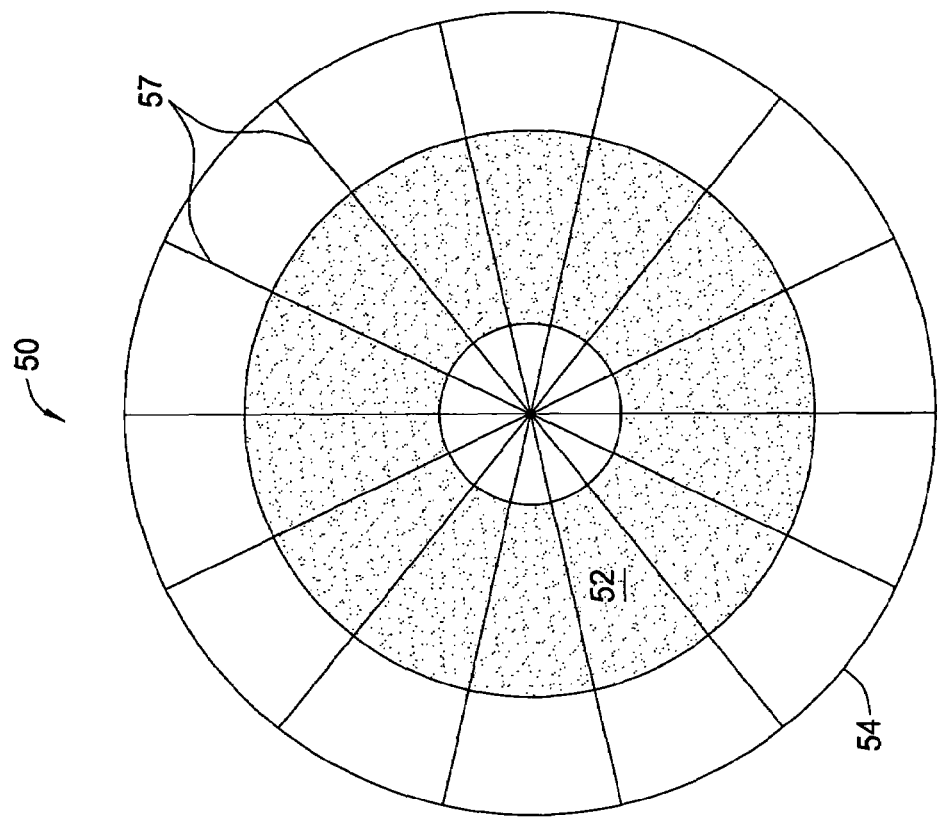
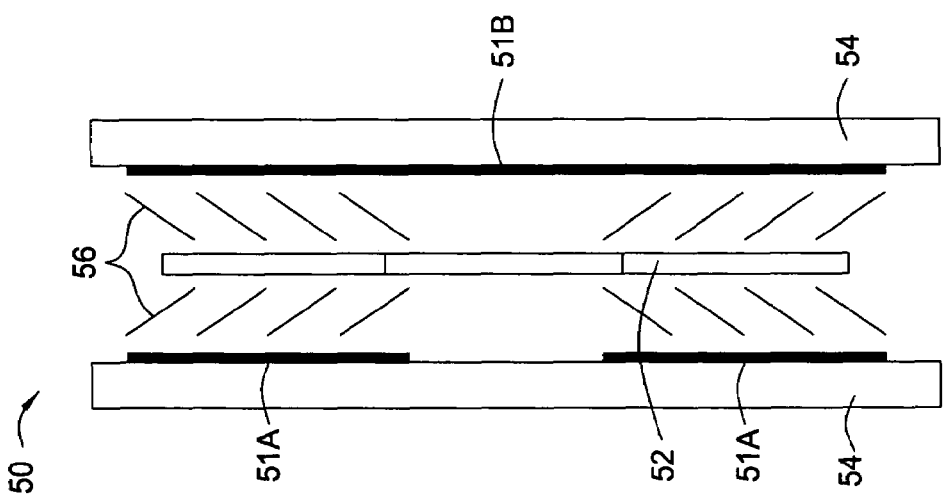
FIG. 5B
FIG. 5A

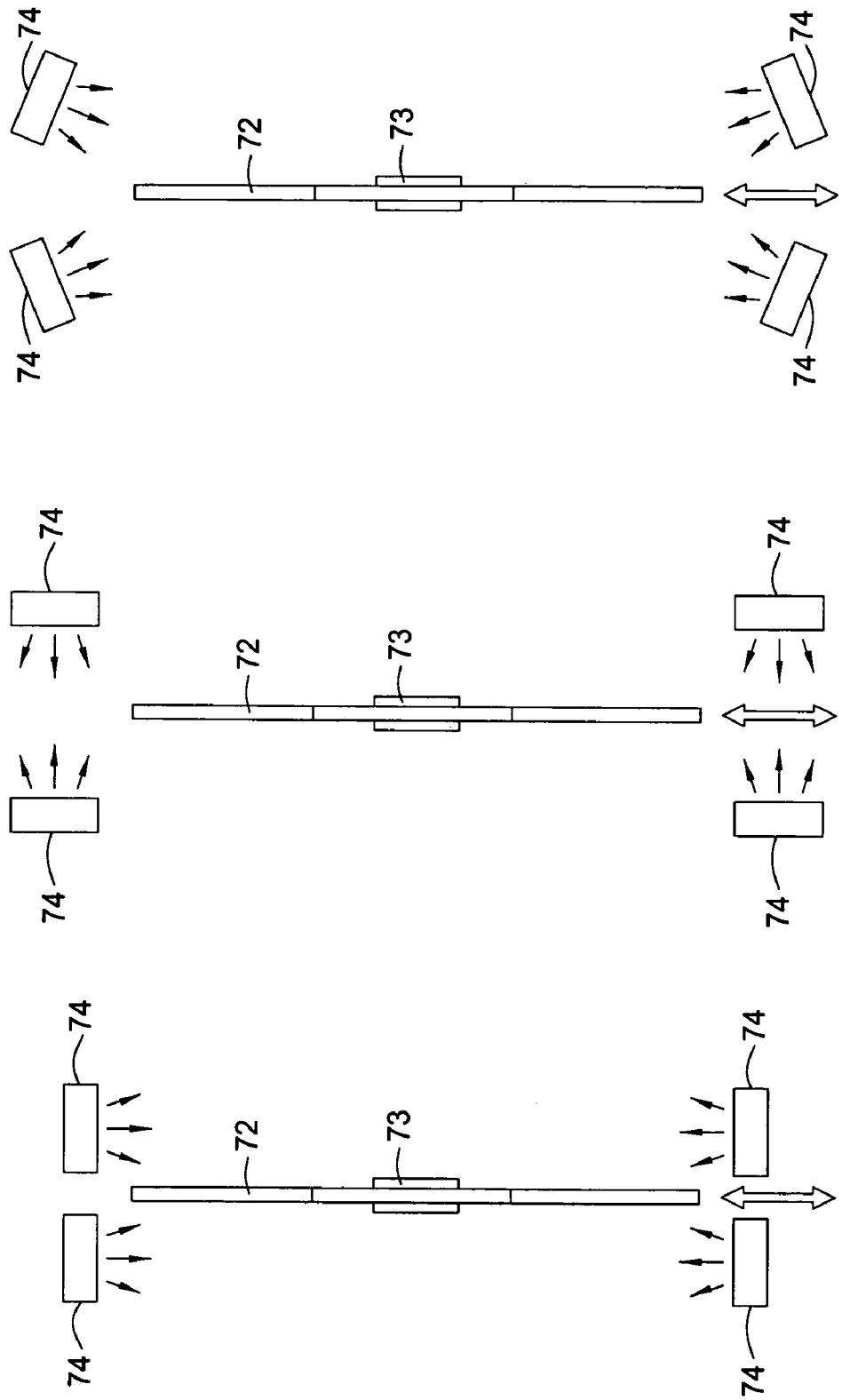

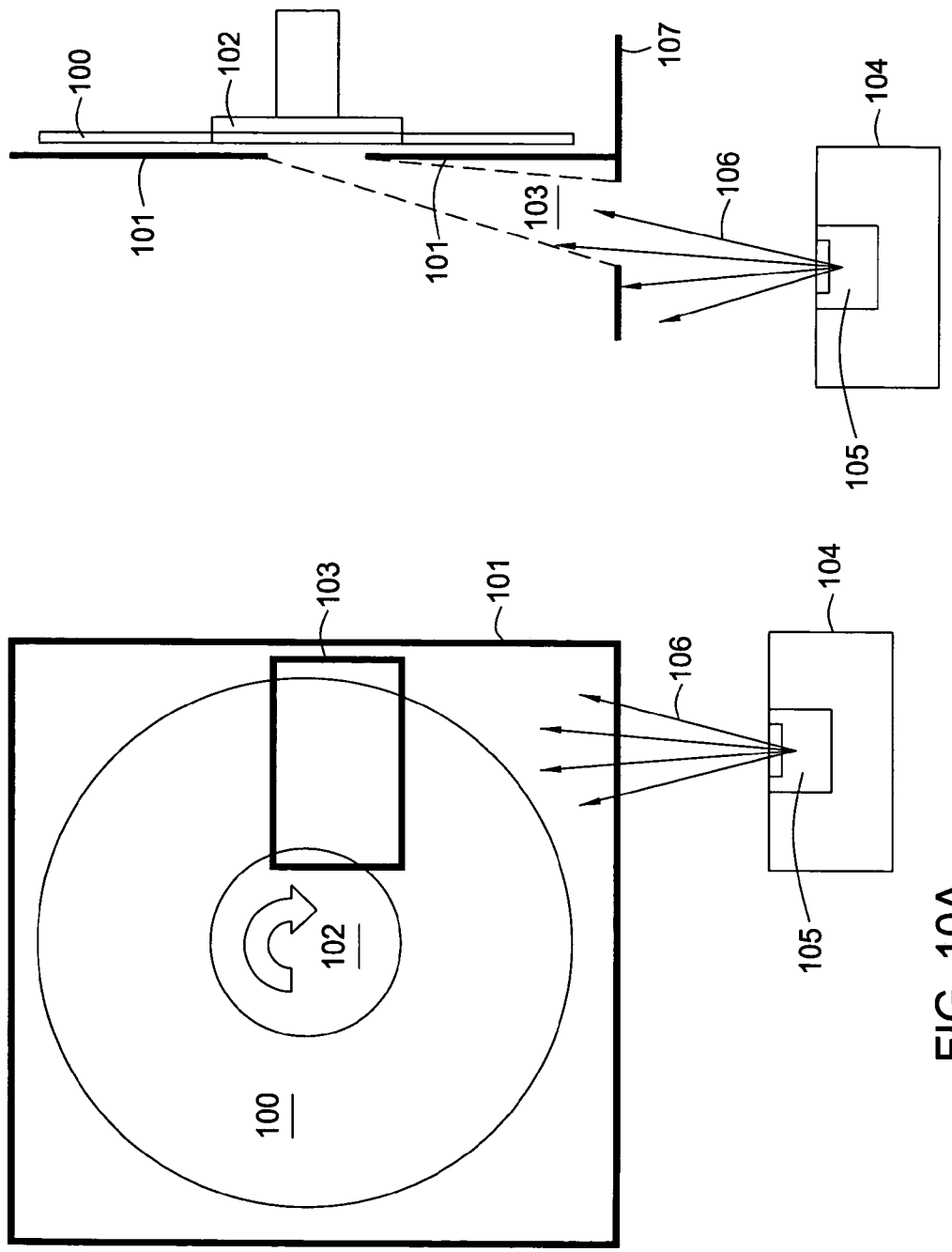

METHOD FOR SPUTTERING MAGNETIC RECORDING MEDIA

FIELD OF THE INVENTION

Embodiments of the invention generally relate to apparatus and methods for directional deposition of material on magnetic recording media and more specifically, for deposition of tilt perpendicular media.

BACKGROUND OF THE INVENTION

Magnetic and magneto-optical media are extensively employed in the computer industry and can be locally magnetized by a write transducer or write head to record and store information. The write transducer creates a concentrated magnetic field which is directionally alternated based upon specific bits of the information being stored. When the local magnetic field produced by the write transducer is greater than the coercivity of the recording medium, grains of the recording medium at that location are magnetized. The grains retain their magnetization after the magnetic field produced by the write transducer is removed. The direction of the magnetization matches the direction of the applied magnetic field. The magnetization of the recording medium can subsequently produce an electrical response to a read sensor, allowing the stored information to be read.

Magnetic recording media with higher storage capacity, less noise when reading or writing and lower production cost is increasingly in demand. Therefore, efforts have been made to reduce the size (e.g., nanometer range) of recording media required to magnetically record bits of information. Also, the integrity of the information must be maintained as size is decreased. The space necessary to record information in magnetic recording media depends upon the spacing of transitions between oppositely magnetized areas. Generally, these transitions are nanometers in size. It is, therefore, desirable to produce magnetic recording media that will support the smallest transition size possible. However, the output transitions from smaller recording media must avoid excessive noise (generally expressed in signal-to-noise ratio (SMNR)) to reliably maintain the integrity of the stored information.

In general, achieving a magnetic recording media having acceptable characteristics involves microstructural and crystallographic control of the media materials during a deposition process. Such control is typically attempted by manipulating the deposition process and proper use of underlayers and seedlayers (e.g., templating the magnetic layer). In spite of these improved techniques for higher quality media, such as less noise and higher storage capacity, traditional perpendicular media remains the deposited material.

Tilted perpendicular media has been proposed as a means to write higher anisotropy magnetic recording media than otherwise possible using conventional perpendicular recording schemes, since more grains are distributed along a similar magnetic path. Therefore, smaller grain size and higher areal density of tilted perpendicular media has an extended thermal stability compared to conventional perpendicular media. The basic advantage of the tilted geometry is suggested by the dependence of the switching field on the applied field angle, graphically shown for an ideal Stoner-Wohlfarth particle in FIG. 1. The graph contains several regions, such as region 2 for conventional perpendicular overwrite media, region 4 for conventional perpendicular writing media and region 6 for tilted perpendicular writing and overwrite media. Ideally, a minimum switching field of $½H_k=K/M_s$ is realized for an applied field direction of 45° to the particle magnetic easy axis, where K is the uniaxial anisotropy constant and $M_s$ is the saturation magnetization. This minimum value is one-half the maximum switching field of $H_k=2K/M_s$, realized for an applied field direction of 0°, i.e., head-on to the easy axis. Conventional perpendicular recording structures using a soft magnetic underlayer and perpendicular easy axis for the recording layer typically operate close to the head-on geometry, where switching is in fact least efficient.

Region 2 depicts conventional perpendicular overwrite media with head-on geometry and a write field of 5°±6° with respect to media $H_k$. Region 4 depicts conventional perpendicular writing media with a slightly lower switching field than perpendicular overwrite media. Conventional perpendicular writing media has a slight geometric grade and a write field of 12°±6° with respect to media $H_k$. However, region 6 depicts titled perpendicular writing and overwriting media with only about 50% of the switching field than that required in conventional perpendicular overwrite media. The ideal write field is about 45°±8° with respect to media $H_k$. Therefore, the minimum switching field is achieved as the field angle increases to 45°. Hence, the use of tilted symmetry material will inherently minimize the switching field. The art is deficient while providing adequate processes and apparatuses to deposit tilted perpendicular media.

Therefore, there is a need for an apparatus and method for depositing tilted symmetry material on a magnetic recording medium. Furthermore, there is a need to control the angle the material is deposited to the substrate.

SUMMARY OF THE INVENTION

Generally, methods and apparatus are disclosed for fabrication of angle-of-incidence layers on a disk. The angle-of-incidence layers may have either radial or circumferential tilt symmetry, using, for example, sputtering or evaporation techniques.

In one embodiment, the present invention generally provides a method for depositing material on a substrate by disposing the substrate on a support member, sputtering material from a cathode positioned in substantially facing relationship with respect to a surface of the substrate and positioning a shutter plate between the substrate and the cathode. The shutter plate has an aperture formed therein, wherein the shutter plate restricts transmission of sputtered material through the aperture in a direction normal to the surface of the substrate.

In another embodiment, the present invention generally provides an apparatus for sputtering material including a substrate support member, a cathode positioned in substantially facing relationship with respect to the substrate support member. The apparatus further includes a shutter plate disposed between the substrate support member and the cathode that defines an aperture for selective transmission of sputtered particles from the cathode on the basis of a non-perpendicular trajectory angle.

In another embodiment, the present invention generally provides a method for depositing material on a substrate including positioning at least one cathode in an off-center relationship with respect to the substrate and orienting a face of the at least one cathode to achieve a non-perpendicular incidence angle of material sputtered from the face of the cathode. In another embodiment, two cathode pairs are utilized and each cathode pair effects deposition on opposite sides of a substrate.

In another embodiment, the present invention generally provides a method for depositing material on a substrate including positioning the substrate on a substrate support member, sputtering material onto the substrate from a plurality of cathodes each having a line of sight to the substrate. Each cathode is disposed at a radial distance from a center of the substrate and each cathode is configured to sputter directionalized material at a non-perpendicular trajectory angle relative to the substrate.

In another embodiment, the present invention generally provides an apparatus for depositing material on a substrate including a substrate support member, a first cathode assembly comprising at least two cathodes and a second cathode assembly comprising at least two cathodes. The at least two cathodes of the first cathode assembly and the second cathode assembly are rotatably disposed relative to the substrate support member and are configured to produce directionalized sputtered material having a non-perpendicular trajectory angle relative to the substrate.

In another embodiment, the present invention generally provides an apparatus for depositing material on a substrate including a substrate support member adapted to support the substrate, a pair of cathodes in opposing facing relationship and having the substrate support member disposed therebetween, a baffle assembly disposed on either side of the substrate support member and between the pair of cathodes. The baffles are of a geometric shape selected to allow passage of sputtered material from the cathodes onto the substrate at a desired tilt angle.

In another embodiment, the present invention generally provides an apparatus for depositing material on a substrate including a cylindrical cathode forming a central opening, a support member disposed in the central opening and a plurality of substrates disposed on the support member in a stacked arrangement and separated from one another by a gap. The substrates are disposed generally perpendicular to a cathode in at least one embodiment so that material traveling at a desired tilt angle to the substrate.

In another embodiment, the present invention generally provides an apparatus for deposition of material onto a substrate including a pair of ring-shaped cathodes having a diameter at least as large as the substrate and forming a substrate transfer passageway between the cathodes and a substrate transfer member configured to support the substrate and transfer the substrate through the substrate transfer passageway. The pair of ring-shaped cathodes is positioned to deposit the material to the substrate with a desired tilt angle.

In another embodiment, the present invention generally provides a method for depositing material on a substrate including disposing the substrate on a support member, depositing material by an evaporation process from a reservoir positioned in a facing relationship to a portion of the substrate and positioning a shutter plate between the substrate and the reservoir. The shutter plate has an aperture formed therein which restricts transmission of a portion of the evaporated material through the aperture according to a trajectory angle of the deposited material.

In another embodiment, the present invention generally provides an apparatus for depositing material including a substrate support member, a reservoir positioned facing a portion of the substrate support member, a shutter plate disposed between the substrate support member and the reservoir. The shutter plate includes an aperture for selective transmission of deposited articles from the reservoir on the basis of a non-perpendicular trajectory angle.

BRIEF DESCRIPTION OF THE DRAWINGS

FIGS. 5A-C show stationary cathodes with a nested radial baffle assembly and/or an array of radially oriented baffles;

FIGS. 7A-C show ring-shaped cathodes for inward sputtering, cross-wise sputtering and angular sputtering;

FIGS. 10A-B show oblique incidence evaporation for circumferential tilt growth symmetry during single-sided deposition.

DETAILED DESCRIPTION

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Generally, methods and apparatus are disclosed for fabrication of angle-of-incidence layers on a disk. In one embodiment, the angle-of-incidence layers may have radial and/or circumferential tilt symmetry. Deposition techniques for forming the layers on the disk include, for example, sputtering or evaporation techniques capable of producing directional material according to the desired tilt symmetry. The methods are considered capable of providing adequate uniformity, sufficient throughput, and suitable inventory for high rate, single-sided or double-sided, continuous fabrication processing on disk-based sputter or evaporation production tools.

Figure 1:
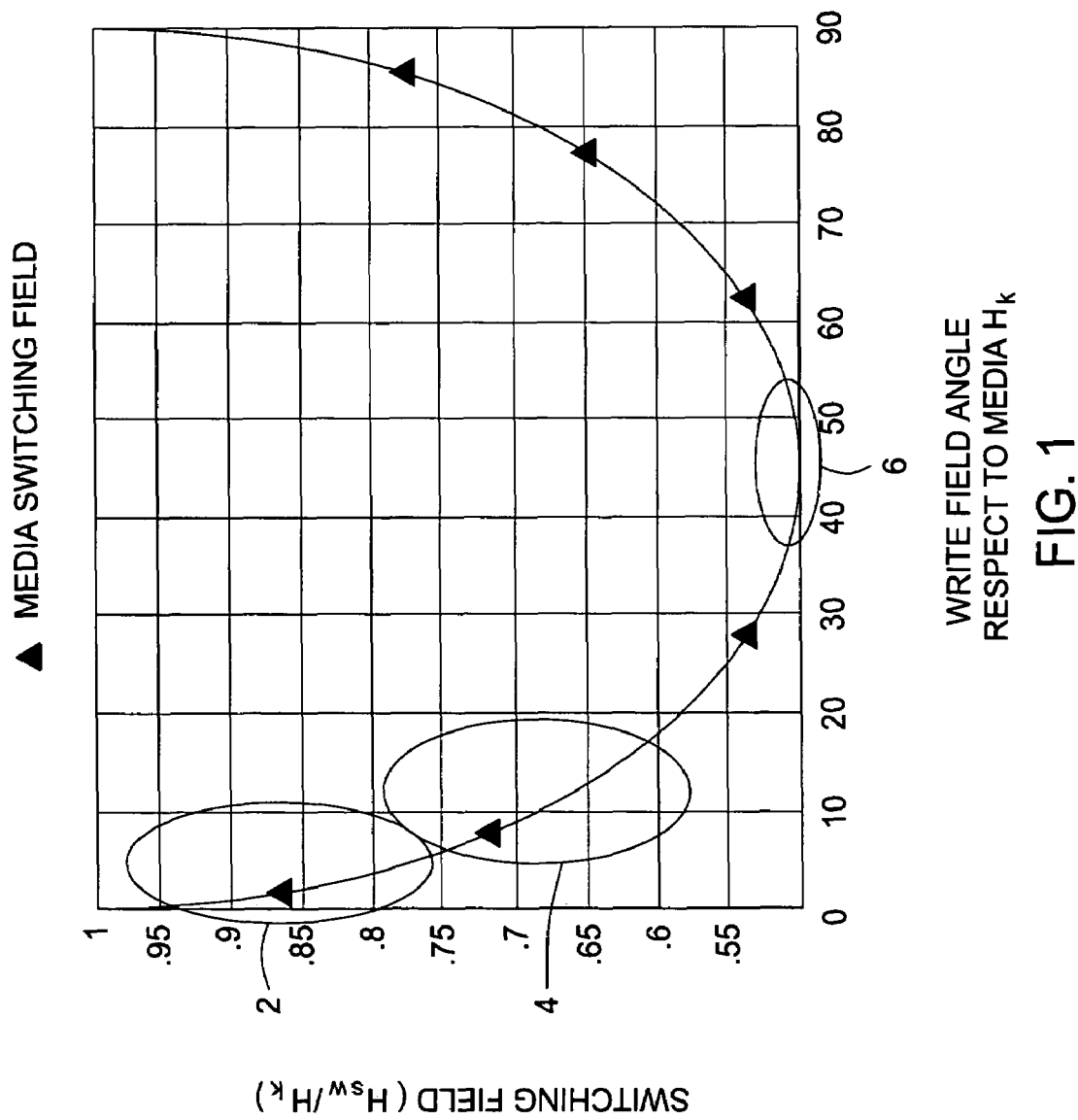
FIG. 1 is a graph illustrating the dependence of the switching field on applied field angle, shown for an ideal Stoner-Wohlfarth particle.
Figure 2A:
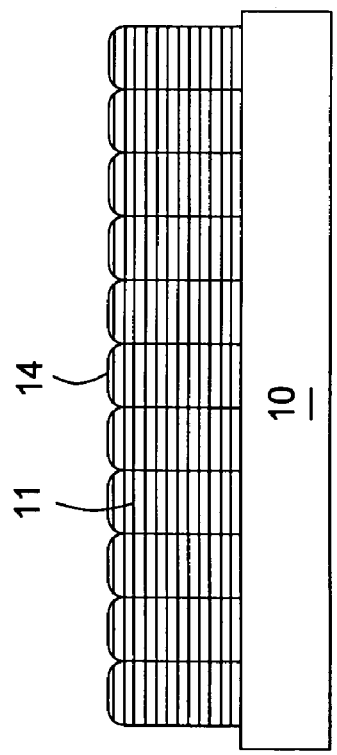
FIGS. 2A-C show a schematic comparison of perpendicular and tilted film geometries.
Figure 2C:
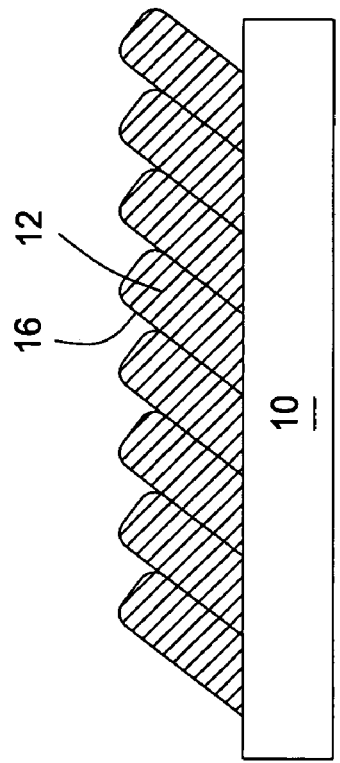
Figure 2B:
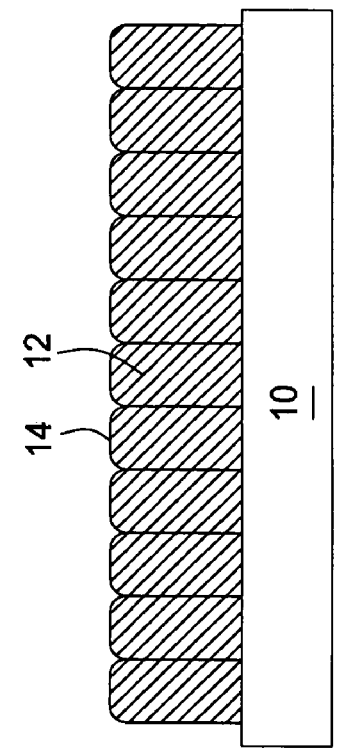

In FIGS. 2A-2C, conventional perpendicular recording media (FIG. 2A) is schematically compared with the tilted perpendicular recording media (FIGS. 2B-C) on disk 10. The easy axis in the recording layer is tilted to take advantage of the substantially reduced switching field required to record information. For a given write field magnitude, tilting the easy axis allows the anisotropy K to be increased without compromising writability. The media in FIG. 2A contains perpendicular grains 14 and perpendicular texture 11, while the media in FIG. 2C contains tilted grains 16 and tilted texture 12. FIG. 2B illustrates a media containing perpendicular grains 14 and tilted texture 12. The particle volume, which fundamentally determines the transition width and linear recording density, can then be reduced while maintaining an acceptable thermal stability ratio KV/kT. Generally, larger particle volumes correlate to larger transition width. Further advantages of the tilted easy axis are a reduced switching time due to the large reversal torque, and a narrower track-to-track guard band resulting from increased multi-pass thermal erasure stability.

For rotating disk applications with a bit width to bit length aspect ratio greater than one, the optimal easy axis tilt direction is thought to be radial. Physically perpendicular grains with tilted c-axis and correspondingly tilted easy axis texture have been experimentally demonstrated using angle-of-incidence seed layers. In these experiments, a highly directional ion beam deposition source was used to create a tilted columnar thin film microstructure, onto which a Co-alloy recording layer was sputter deposited with resultant tilted c-axis texture yet perpendicular physical grain morphology. Such a microstructure, with the c-axis (magnetic easy axis) tilted in the radial direction, is considered promising for practical realization of the theoretical concept. However, many challenges remain to develop a practical disk media manufacturing process, such as available materials, control during deposition and cost of manufacture.

Generally, easy axis is the axis along which the magnetic moment spontaneously aligns in the absence of an applied external field. The internal magnetization is stable when pointing parallel to the easy direction. Circumferential tilt symmetry, used herein, is the easy axis lies in the plane defined by a vector tangential to a circle centered on the disk (a track) and a vector normal to the disk surface. Radial tilt symmetry, used herein, is the easy axis lies in the plane defined by a vector along the disk radial direction and a vector normal to the disk surface.

Figure 3A:
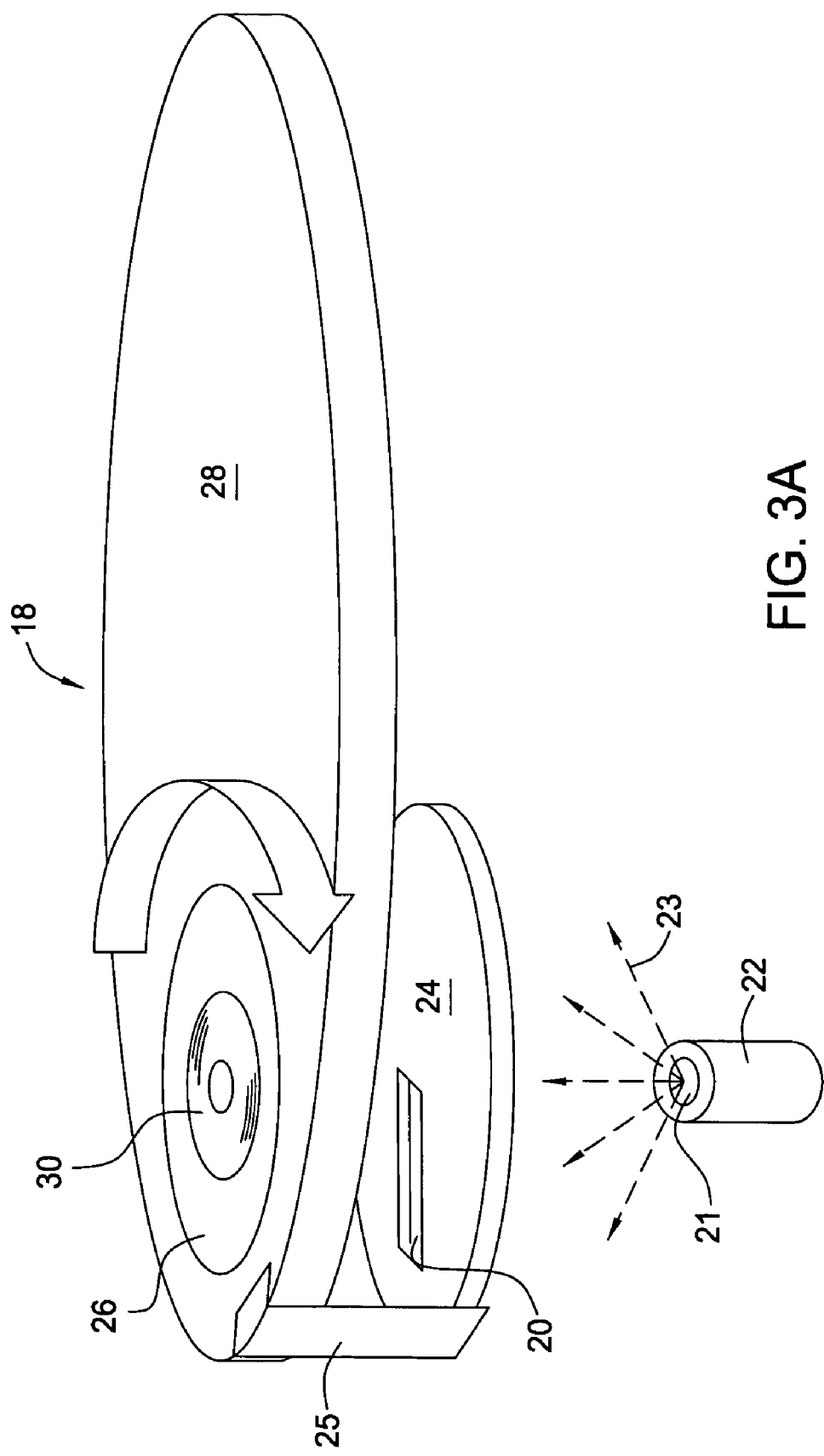
FIGS. 3A-C show a shutter plate used between a stationary sputter cathode and a rotating disk substrate to control the incident angle of sputter deposition.
Figure 3C:
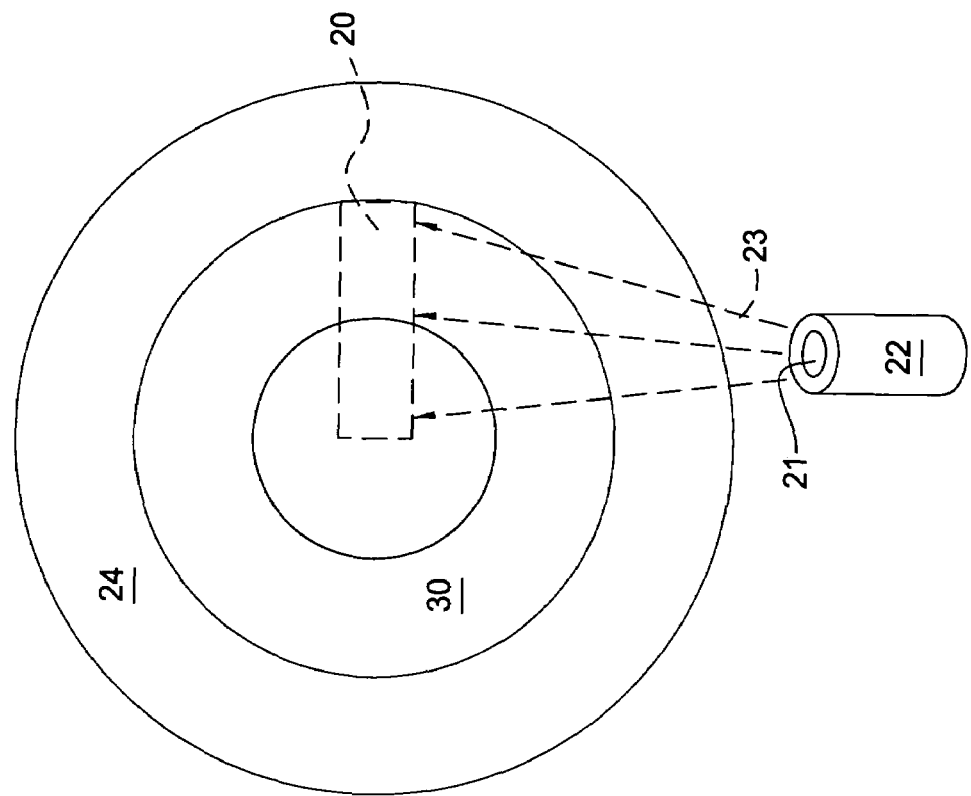
Figure 3B:
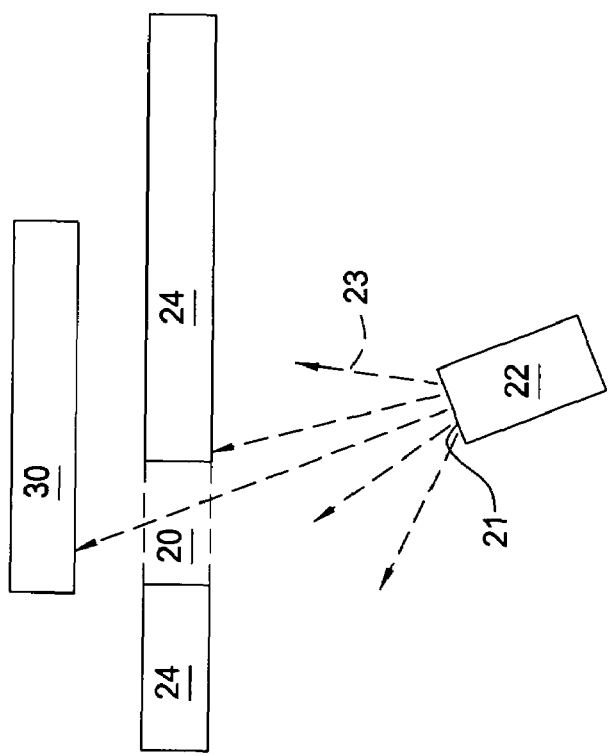

One embodiment of an apparatus for depositing material on a disk is depicted by system 18 in FIGS. 3A-3C. System 18 utilizes an aperture 20 in shutter plate 24 disposed between the sputter cathode 22 and disk 30 to constrain the angle of the depositing flux. Aperture 18 is shown in FIG. 3A with a radially-oriented, rectangular geometry, but aperture 20 may have other geometries (e.g., square, circular, triangular or trapezoidal) and dimensions. A mounting bracket 25 connects the shutter plate 24 to the table 28. A collimator (not shown) is optionally applied between cathode 22 and shutter plate 24.

Sputter cathode 22 emits sputtered materials at various trajectories 23 via source 21 including perpendicular and non-perpendicular angles with respect to the disk 30. The shutter plate 24 restricts transmission of a portion of sputtered material, while the aperture 20 allows passage of sputtered material with specific trajectories. In one embodiment, a rotational speed is selected for the disk 30 while resting on a rotatable nest 26 supported by a table 28.

In another embodiment, cathode 22 and/or shutter plate 24 are movable to produce a tilted angle relative to the plane of the disk 30. The relative placement of the disk 30, sputter cathode 22 and aperture 20 controls the degree of tilt angle and symmetry, i.e., radial or circumferential of the deposited material.

The relative placement of the disk 30, sputter cathode 22 and aperture 20 is proportional to the tilted angle of the media. That is, tilted media with angles between about 30° and about 60° relative to the surface of the disk can be derived with the relative placement of the disk, cathode and shutter plate/aperture. Preferably, the deposited material has a tilt angle of about 45°. Therefore, the adjustment of all or any one of these variables proportionally alters the tilt angle of the deposited material. In one example, sputter cathode 22 and aperture 20 remain in position while disk 30 is shifted to adjust the tilt angle. In another example, sputter cathode 22 and disk 30 remain in position while aperture 20 (i.e., by moving shutter plate 24) is shifted to adjust the tilt angle. In another example, disk 30 and aperture 20 remain in position while sputter cathode 22 is shifted to adjust the tilt angle. The configuration of the apparatus provides an advantage of flexibility, e.g., easy adjustment of deposition geometry since disk 30, sputter cathode 22 and/or aperture 20 independently can be adjusted. Therefore, disk 30, sputter cathode 22 and/or aperture 20 is/are adjusted while any one or two of the other(s) remain in position.

Radial uniformity can be achieved using multiple cathodes and apertures material deposition to the surface of disk 30, such as sequentially alternating between cathodes containing different sources or simultaneously sputtering with two or more cathodes. Rotation of the disk 30 during deposition assures circumferential uniformity. Rotation is generally maintained in the range from about 20 rpm to about 1,000 rpm, preferably from about 50 rpm to about 100 rpm. The time needed to deposit the media material depends on several variables, such as material composition, size of disk, power supply and other process parameters. Exposure time is about 20 seconds or less for a 95 mm OD disk. Preferably, the exposure time is in a range from about 2 seconds to about 20 seconds, more preferably, the exposure time is in a range from about 3 seconds to about 8 seconds. In one embodiment, material is deposited across the substrate equally with respect to time. In another embodiment, material is deposited with inconsistent uniformity with respect to time. In another embodiment, radial uniformity can be achieved on both sides of a disk, i.e., double-sided coating is also possible.

In one embodiment, the sputter cathode 22 is displaced from the center axis of the disk 30 by an angle in the range from about 30° to about 60° relative to the substrate normal. Preferably the easy axis of the deposited material has a tilt angle in the range from about 40° to about 50° relative to the substrate normal, more preferably at about 45° relative to the substrate normal. Herein, substrate normal is a term used to define the 90° axis from the plane of the substrate or disk, wherein the plane is consistent with the circumference of the substrate or disk. In one embodiment, the axis of the cathode 22 is 90° to the plane of disk 30 and off centered relative to the axis of the disk 30. Therefore, the trajectory angle of the depositing material not obscured by the shutter plate 24 inherently has the tilt angle of the deposited material. In another embodiment, the cathode 22 is less than 90° from the disk 30 and is centered or off centered relative to the axis of the disk 30. The angle is measured from the plane of the disk 30, that is, when the cathode is facing the disk 30, an axis through the cathode extends normal to the disk 30. Generally, the sputter cathode 22 is displaced from the disk 30 at a distance from about 2.54 cm to about 15.24 cm, preferably from about 5.08 cm to about 7.62 cm. The shutter plate 24 can be substantially parallel with respect to the disk 30.

FIG. 3B depicts shutter plate 24 shielding portions of the sputtered materials at various trajectories 23 from source 21. Sputtered material traveling along the desired angle pass through aperture 20 and deposits on disk 30. FIG. 3C depicts another viewpoint of the same embodiment, whereas selected angles of sputtered materials at various trajectories 23 pass through aperture 20 and deposits to disk 30. Excess sputtered material is collected on various surfaces within the process chamber, including the inner walls of the chamber, the shutter plate 24, the mounting bracket 25 and the rotatable nest 26. The excess sputtered material is removed from the chamber during regular cleaning.

Figure 4B:
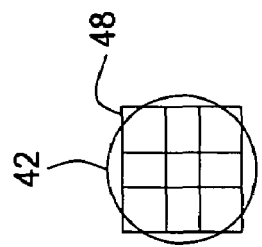
FIGS. 4A-C show rotating cathodes with radial or circumferential tilt and channeled filters.
Figure 4A:
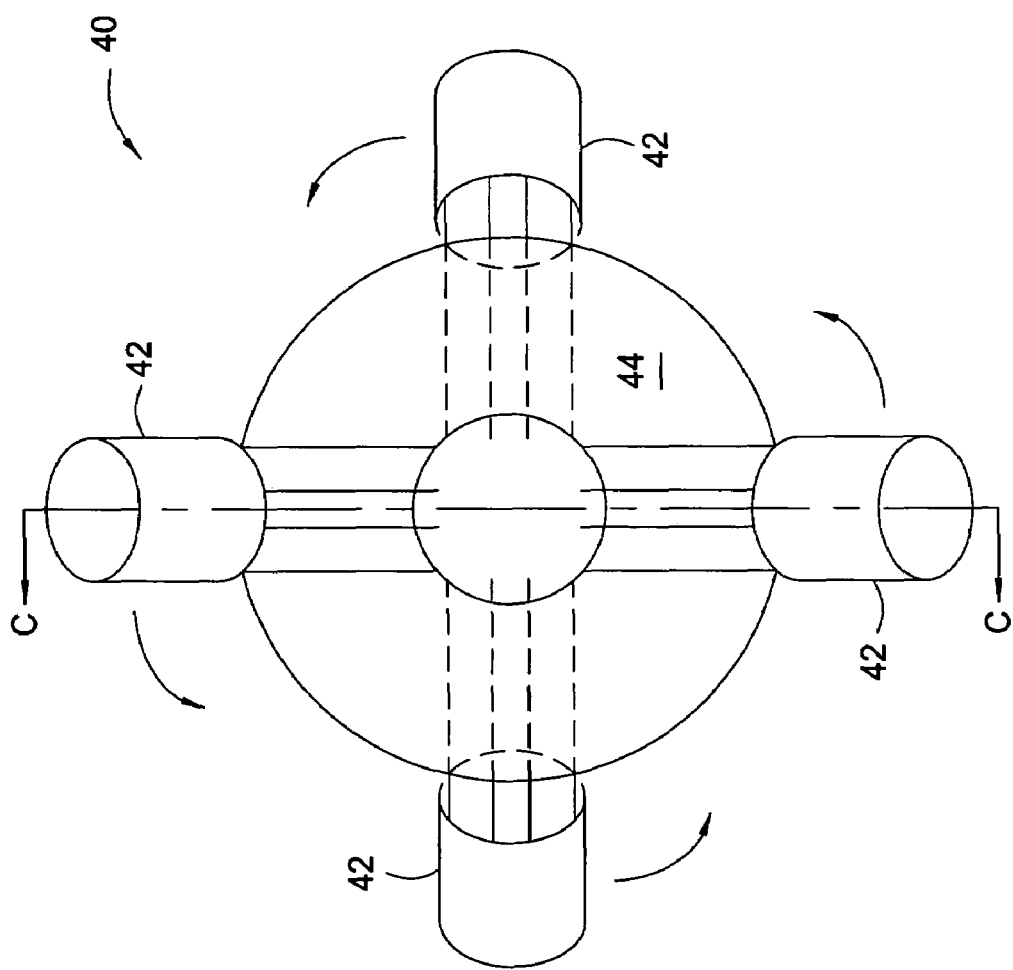
Figure 4C:
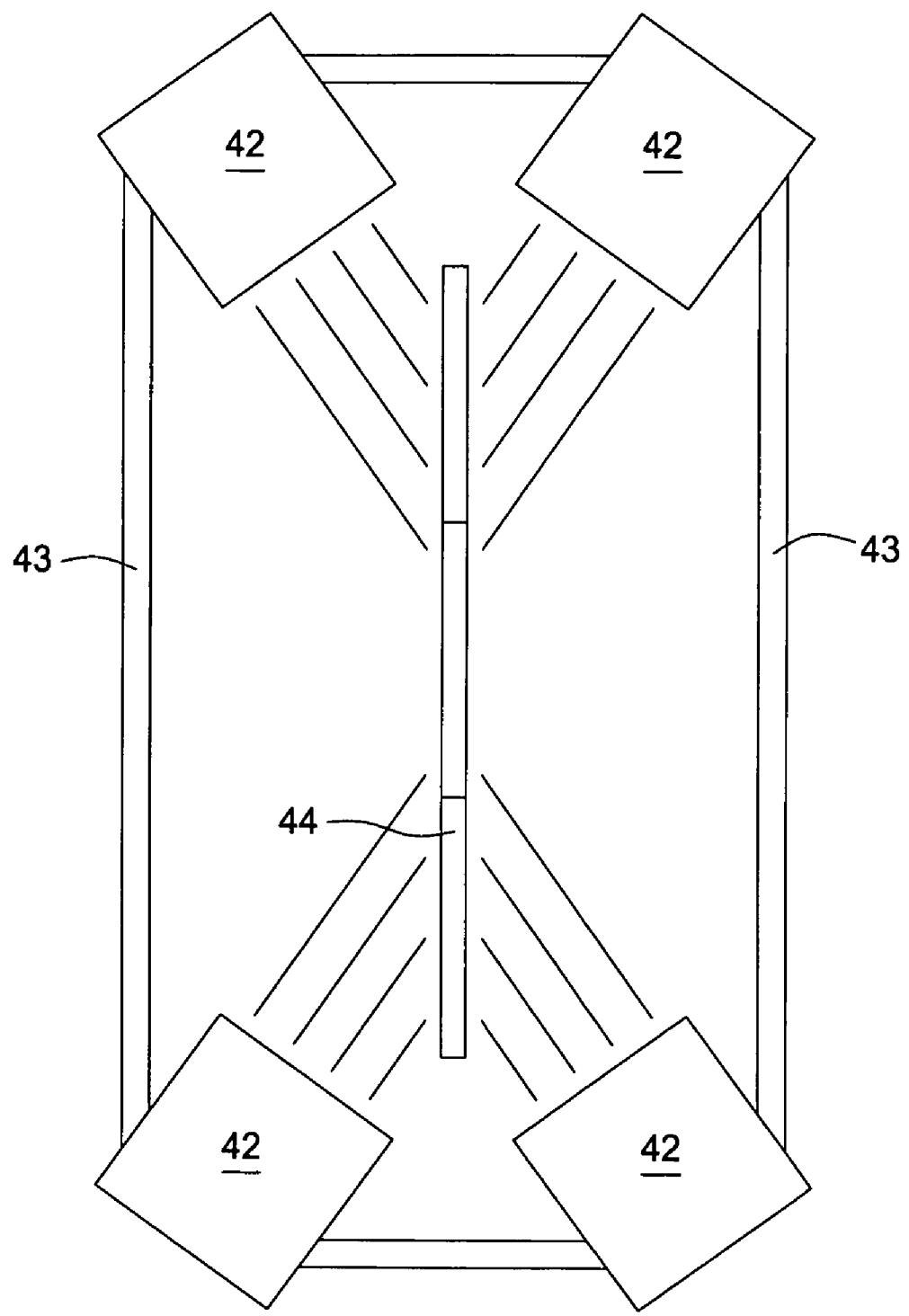

FIGS. 4A-4C illustrate another embodiment of system 40 configured to achieve tilted symmetry of media material.

FIG. 4A is a front view of the system 40 and includes a stationary disk 44 sitting on a pedestal (not shown). System 40 contains a cathode assembly 43 with the individual cathodes 42 tilted either radially and/or circumferentially to generate the desired directionality of the depositing flux. FIGS. 4A and 4C (side view) illustrate system 40 including rotating cathodes 42 with a radial tilt. The cathodes 42 are positioned in angles relative to the desired tilt angle of the deposited media. In one embodiment, there is overlap of the perimeter between a cathode 42 and disk 44. Generally, the cathodes 42 have relative angles in the range from about 30° to about 60°, preferably from about 40° to about 60° with respect to substrate normal.

To further reduce the spread in flux incident angle, various shields or channeled filters 48 (e.g., collimator) can be disposed between the cathodes 42 and the disk 44, i.e., appended to the cathode structure, as illustrated in FIG. 4B. For radial uniformity of film thickness and tilt angle, the cathodes can be staggered at different radii, if necessary. For example, one cathode is angled towards the outer circumference of the disk, while another cathode positioned at a shorter radius is angled to a more inner circumference of the disk than the first cathode. In one embodiment, the cathode assembly 43 rotates about the disk 44 at a rate of between about 100 rpm to about 1,000 rpm. In another embodiment, though not shown, relative rotation is achieved by rotating the disk and maintaining the cathode assembly stationary. Circumferential uniformity results naturally from the rotating motion of the cathodes, so long as an integral number of cathode revolutions are maintained during the deposition process. At least one rotating cathode assembly 43 on each side of the disk 44 is illustrated in FIG. 4C.

System 40 offers several different features which enable high volume production. First, from the point of view of particle generation, the cathode assembly 43 can be well removed (i.e., distanced) and shielded from the surface of the disk 44. Therefore, the surface of disk 44 will be less contaminated with irregular particulates when the cathode assembly 43 is farther from disk 44. Second, the tilted cathodes 42 enable an increased proportion of material to be deposited on the disk 44.

Figure 5C:
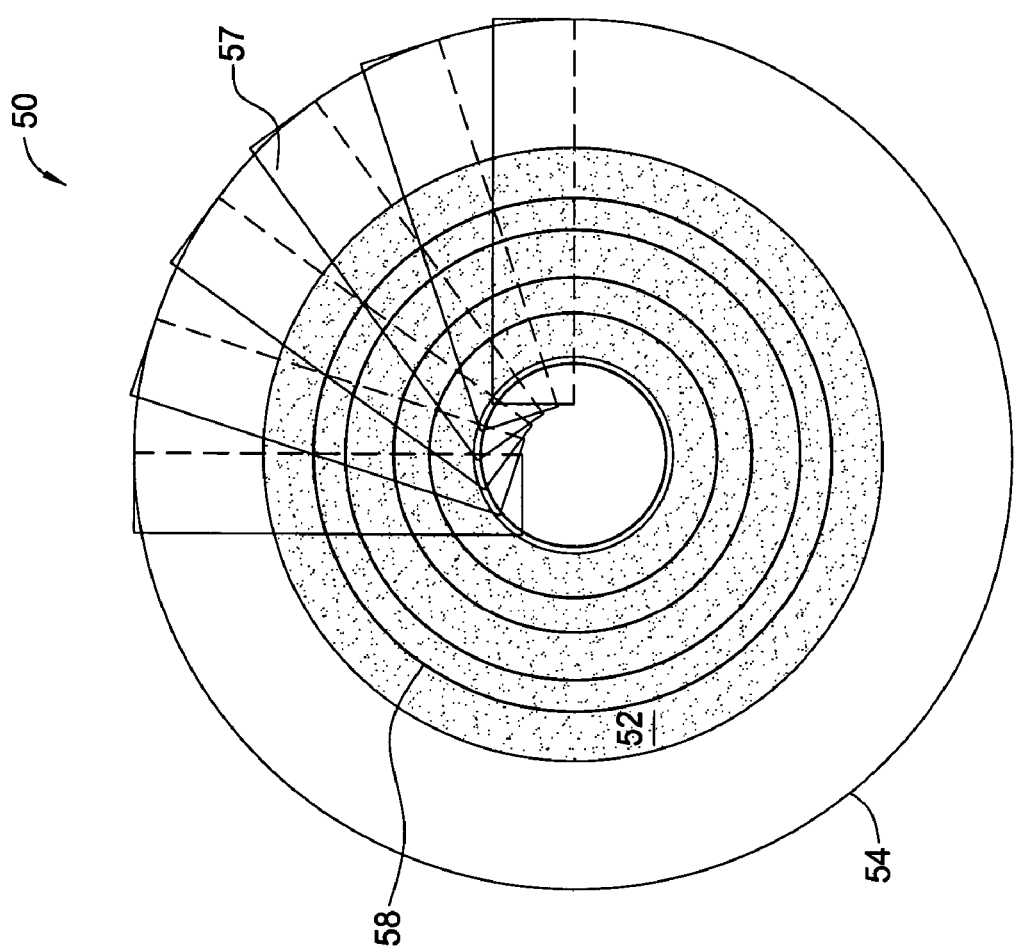

FIGS. 5A-5C show an embodiment of system 50, such that at least one stationary large diameter target 51A and/or 51B is implemented to deposit media to a fixed disk 52. Targets are independently with a hole on the center, as in target 51A, or consistent (without a hole in the center), as in target 51B. In FIG. 5A, a disk 52 is disposed between a pair of cathodes 54. The radial baffles 56 are disposed in a nested configuration to ensure radial symmetry, i.e., any point at a given radius is symmetrical (e.g., thickness) to all points with the same radius. The disk 52 may be resting on a pedestal (not shown). Also, radial baffles 56 are between the disk 52 and each cathode 54. The radial baffles 56 are of a geometric shape selected to produce an angled deposition (e.g., radial tilt) of the sputtered material to the surface of the disk 52. To further reduce the circumferential spread of the depositing flux, radially oriented rib baffles 57 can be added between the radial baffles 56. The baffles direct the depositing material to the surface of the disk 52 at a desired angle.

FIG. 5B illustrates a top view of the radially orientated rib baffles 57. The plane of baffles 57 are turned into the substrate normal for clarity of the illustration. FIG. 5C shows an array of radially oriented rib baffles 57 tilted in the circumferential direction for circumferential tilt (only one quadrant shown). To further reduce the radial spread of the depositing flux, circumferentially oriented rib baffles 58 can be added between the radial elements. The media is uniformly deposited radially across the surface of the disk with the radial baffles 56. The baffles control the flow and angle of the incoming material to be deposited. The trajectory angle from the source to the disk is proportional to the tilt angle of the easy axis of the deposited material.

The stationary cathode and disk are advantageous for manufacturing and the baffles are positioned to diminish any non-uniformity due to shadowing of the depositing flux by the collimating baffles. To minimize such shadowing effects, the thickness of the baffles can be kept to a minimum, such as in a range from about 10 mils to about 50 mils, preferably from about 15 mils to about 25 mils. Also, the spacing between the baffles 56 and disk 52 can be kept as large as possible, such as in the range from about 2 mm to about 10 mm, preferably about 4 mm. The baffles 56 are inclined at relative angles in the range from about 30° and about 60°, preferably from about 40° to about 60° with respect to substrate normal. Furthermore, multiple deposition stations can be used with an offset in baffle location.

Figure 6A:
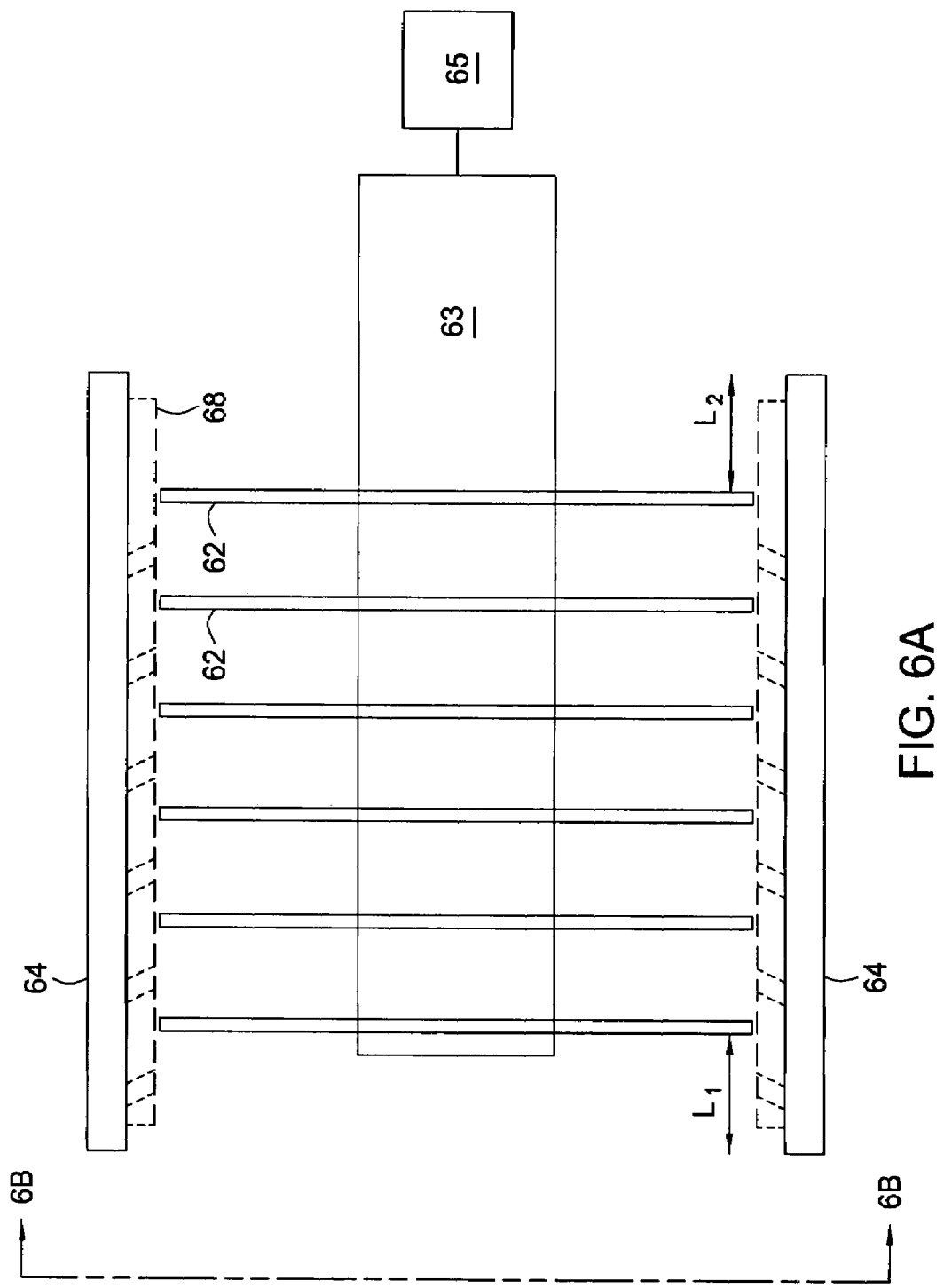
FIGS. 6A-B show a cylindrical hollow cathode source with a multiple disk stack for radial tilt growth symmetry.

FIG. 6A is a side view illustrating a large diameter cylindrical hollow cathode 64 surrounding at least one disk 62. Six disks 62 loaded into cathode 64 are shown. However, disks 62 can number from 1 to about 12. In one embodiment, disks 62 are spaced apart from each other by about 2 cm to about 10 cm. Disks 62 are held in place by a disk support 63. The cathode 64 has an inner diameter from about 6.5 cm to about 20 cm, depending on the size of disks 62. For example, when disks 62 have an OD of 65 mm, then the inner diameter of cathode 64 is in the range from about 7.5 cm to about 10 cm. In one embodiment, cathode 64 is consumed as the sputtering source and is made from the desired deposition material. The disks 62 are rotated by spinning the disk support 63 at a speed from about 50 rpm to about 1,000 rpm while sputtering the media to the surface of the disks 62. An actuator 65 can be used to control the rotation of disk support 63 extending axially within the hollow portion of cathode 64. The rotation of the disks 62 provides a even distribution of the sputtered material. The cathode 64 extends beyond disks 62 by lengths $L_1$ and $L_2$, where $L_1$ is in the range from about 1 cm to about 10 cm and $L_2$ in the range from about 1 cm to about 10 cm.

Figure 6B:
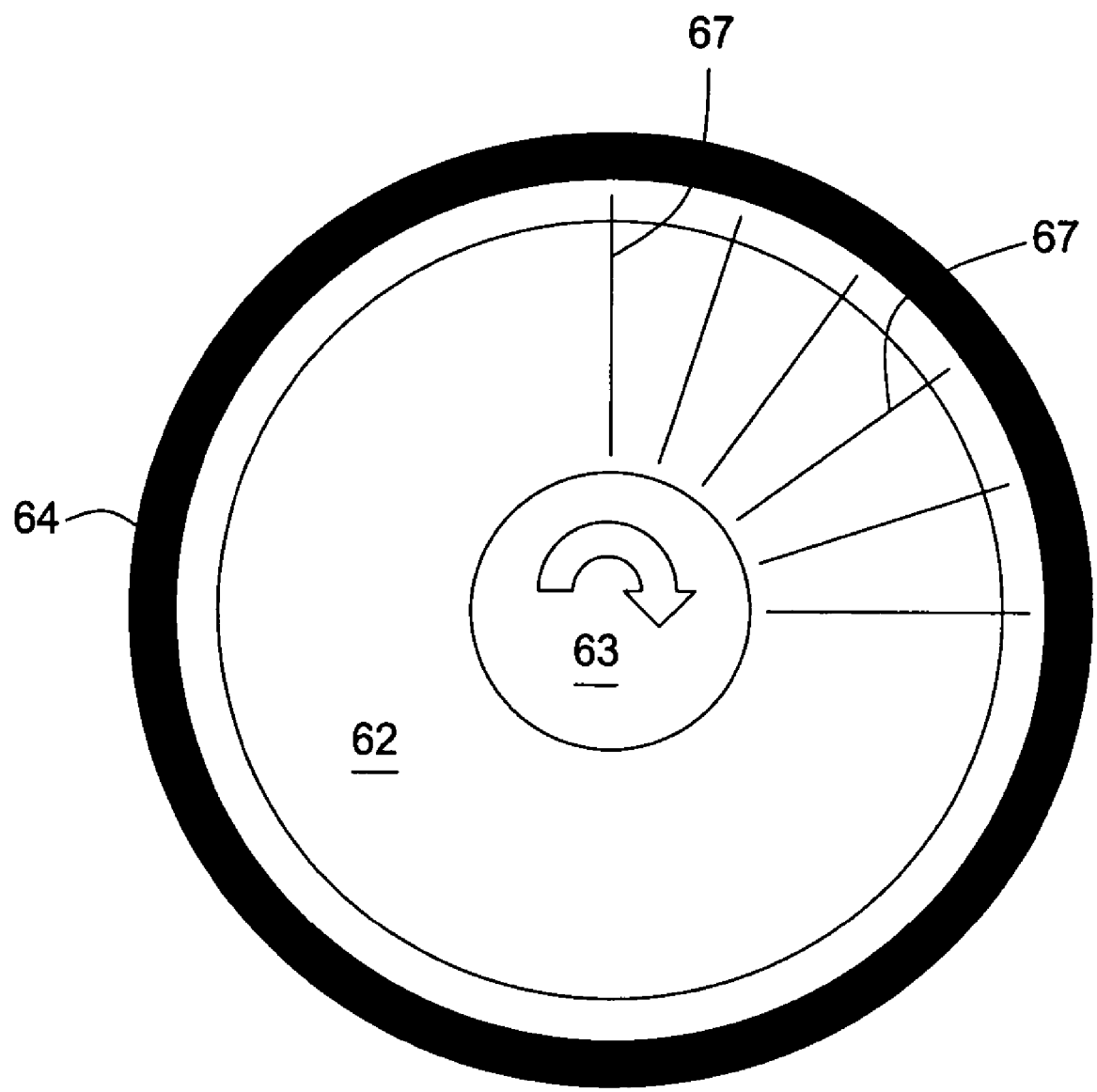

In one embodiment, the radial angle of incidence can be constrained by other disks 62 and excellent target utilization can be achieved. However, in another embodiment, the radial angle of incidence can be constrained by channel configurations formed in optional shields 68. Radial angles of incidence are referenced relative to the plane of disks 62 and range from about 30° to about 60°, preferably from about 40° to about 60°. As shown in FIG. 6B, radial baffles 67 can be added to reduce the circumferential spread of depositing. The disks 62 can be rotated to eliminate shadowing by the radial baffles 67 during a consistent deposition of media with a radial tilt.

FIGS. 7A-C are schematic side views illustrating another embodiment of a deposition system. Two ring-shaped cathodes 74 are spaced with a gap in between to allow disk transport. The gap is in the range from about 0.2 cm to about 10 cm. The disk 72 rests on a pedestal 73.

Three different ring geometries are shown. Specifically, FIG. 7A shows inward sputtering, FIG. 7B shows cross-wise sputtering and FIG. 7C shows angular sputtering. In one embodiment, the disk 72 is positioned between the cathodes 74, such that the cathodes are inwardly positioned towards the disk and the axes of the cathodes are parallel to the disk plane. In another embodiment, the disk 72 is positioned between the cathodes 74, such that the cathodes are cross-wise positioned towards the disk and face the axes of the cathodes are parallel to the disk axis. In another embodiment, the disk 72 is positioned between the cathodes 74, such that the axes of the cathodes are angularly positioned towards the disk such that they make an angle between about 0° and about 90° relative to the plane of the disk. Ring-shaped sputtering sources, such as the Triatron, are available commercially from Unaxis Corporation. The angular configuration, depicted in FIG. 7C, generally offers higher source utilization and higher deposition rates than the inward and cross-sputtering configurations. Radial shields can be added (not shown) to reduce the circumferential spread of depositing flux at the expense of source utilization.

Disks or substrates are made from a variety of materials, such as metals, glass, ceramic, glass-ceramic composite, polymers and plastic. Metal substrates include elemental metals (e.g., Al, Ni, Cr or Co), metal alloys (e.g., AlMg or NiAl) and doped metals (e.g., $NiP_x$). Disks that are round have a variety of outer diameters, including 65 mm, 84 mm and 95 mm. An adhesion layer is generally sputtered onto the disk, followed by a magnetically soft underlayer and a lamination layer. The magnetically soft underlayer may be a material such as Fe—Co—B, Co—Zr, Co—Zr—Cr, Co—Zr—Nb, Co—Ta—Zr, Co—Fe—Zr and Fe—Ta—C. The under layer is deposited to a thickness in the range from about 500 Å to about 1,000 Å. The lamination layer, sputtered onto the magnetically soft underlayer, is usually a metal (e.g., Ta or Ag) and is deposited to a thickness in the range from about 10 Å to about 100 Å, preferably about 25 Å. The magnetically soft underlayer and the lamination layer may be deposited in series several times, namely two to three times. That is, there may by 1-3 layers of the bilayer laminate consisting a magnetically soft underlayer and a wetting layer. The aforementioned layers are generally deposited perpendicular to the disk.

The disk is further processed by depositing recording media including a template layer and a magnetic alloy layer containing tilted grains and tilted texture or containing perpendicularly-oriented grains and tilted texture. In any case, the tilt symmetry can be provided by embodiments of the invention. The template layer is deposited to the soft underlayer and controls the crystal orientation for the forthcoming deposition of the magnetic alloy layer. The control of crystal orientation is due to lattice matching of the under and over layers (i.e., the soft underlayer and magnetic alloy layers). The template layer also incorporates the tilt angle which the magnetic alloy layer will inherit. A template layer can include an amorphous layer and a crystalline layer. The amorphous layer includes a metal layer, such as an Fe—Co—B soft magnetic layer, sputtered to a thickness in the range from about 500 Å to about 1,000 Å, preferably about 800 Å. Amorphous layers also include other metal layers, such as Fe, Fe-alloys, Co, Co-alloys and combinations thereof. The crystalline layer includes a metal layer, such as ruthenium or ruthenium alloys, sputtered to the disk to a thickness in the range from about 50 Å to about 300 Å, preferably about 100 Å. The crystalline layer is grown with small grain size of about 6 nm to about 10 nm. Optionally, a thin layer of a noble metal may be sputtered in between the amorphous and the crystalline layers. The noble metal aids in lattice matching between the two layers. In one example, silver is deposited with a film thickness in the range from about 5 Å to about 200 Å.

The magnetic alloy layer is deposited (e.g., sputtered) to the template layer. Since the template layer has a crystalline top layer, the magnetic alloy layer assumes the desired crystal orientation and takes the existing directional tilt of the template layer. The magnetic alloy layer may be deposited to a film thickness in the range from about 100 Å to about 400 Å, preferably about 200 Å. The magnetic alloy layer may include cobalt and cobalt alloys, such as Co—Pt, Co—Cr, Co—Pt—Cr, Co—Ta, Co—Pt+$O_2$, and Co—Pt+$SiO_2$.

A protective carbon layer is usually deposited to the magnetic alloy layer. The carbon layer generally includes a mixture of sp2 and sp3 carbon and is deposited to a thickness in the range from about 30 Å to about 50 Å.

Embodiments of the invention are conducted within a process chamber suitable to deposit the various described layers. The process chamber may have many process stations (e.g., 12), such as the Intevac MDP 250B, available from Intevac. Further description of useful apparatuses and methods are described in the commonly assigned, U.S. Pat. No. 6,328,856, incorporated herein by reference.

Figure 8:
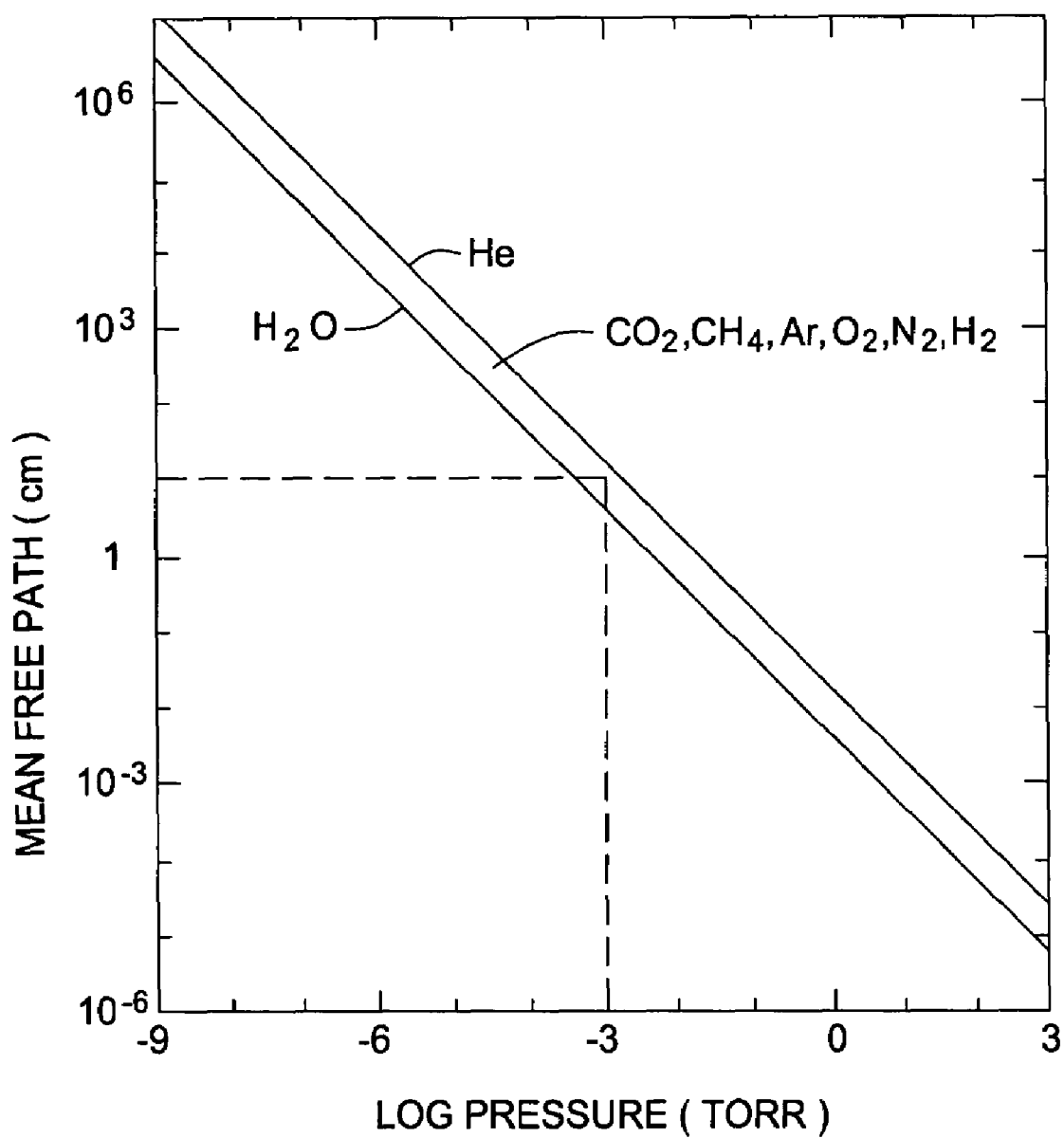
FIG. 8 is a graph illustrating the mean free paths of common gases as a function of pressure.

For methods utilizing sputter deposition, directionality of the depositing species can be maintained only over a finite distance due to scattering in the ambient inert gas. FIG. 8 shows the mean free paths of some common gases based on self-scattering calculations, which can be taken as a rough approximation to the scattering of sputtered metal atoms by ambient Ar atoms. FIG. 8 graphically demonstrates that the mean free path is inversely proportional to the gas pressure. To maximize directionality of the beam, it is desirable to operate at as low a sputtering pressure as possible so as to maximize the mean free path between scattering collisions, and to use a low molecular weight inert gas, e.g., argon or neon. At the lowest practical pressure for conventional magnetron sputtering, about 1 mTorr ($10^{-3}$ Torr) or slightly below, it is seen from FIG. 8 that the mean free path is about 10 cm. This puts a rough upper limit on the target-to-substrate distance over which adequate beam directionality can be maintained for the above sputter methods. It also becomes apparent that beam scattering effects may be a function of radial position on the disk surface for certain of the above sputtering methods, which could lead to non-uniformity of film properties. Therefore, the target-to-substrate distance is maintained in the range from about 5 cm to about 50 cm, preferably between about 5 cm and about 15 cm and more preferably at about 10 cm. Also, the chamber pressure is maintained with a pressure in the range from about $10^{-4}$ Torr to about $10^{-2}$ Torr, preferably at about $10^{-3}$ Torr.

Mean free path issues were avoided altogether in the aforementioned embodiment of the invention because an ion beam deposition technique operated in the high vacuum regime. For high throughput production, however, a high deposition rate technique such as evaporation is also practical. Evaporation is also compatible with high vacuum less than $10^{-5}$ Torr, for which no significant scattering occurs over distances comparable to typical deposition system dimensions.

Figure 9B:
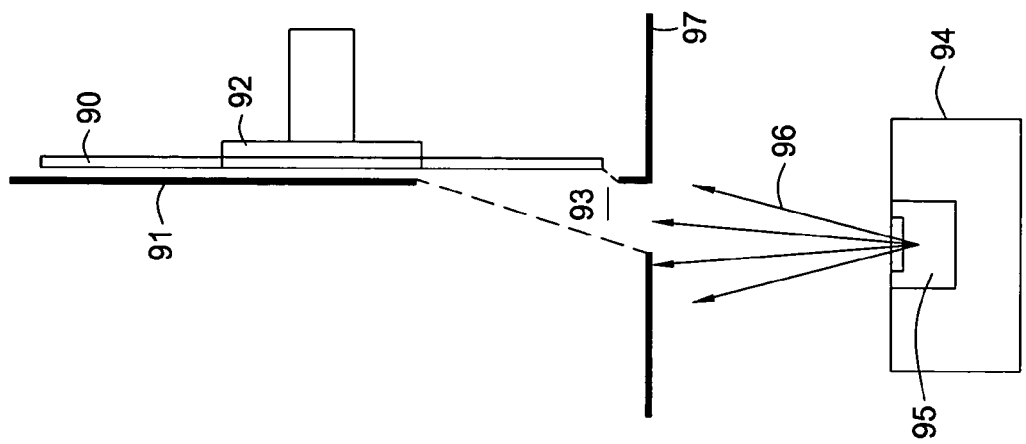
FIGS. 9A-B show oblique incidence evaporation for radial tilt growth symmetry during single-sided deposition.
Figure 9A:
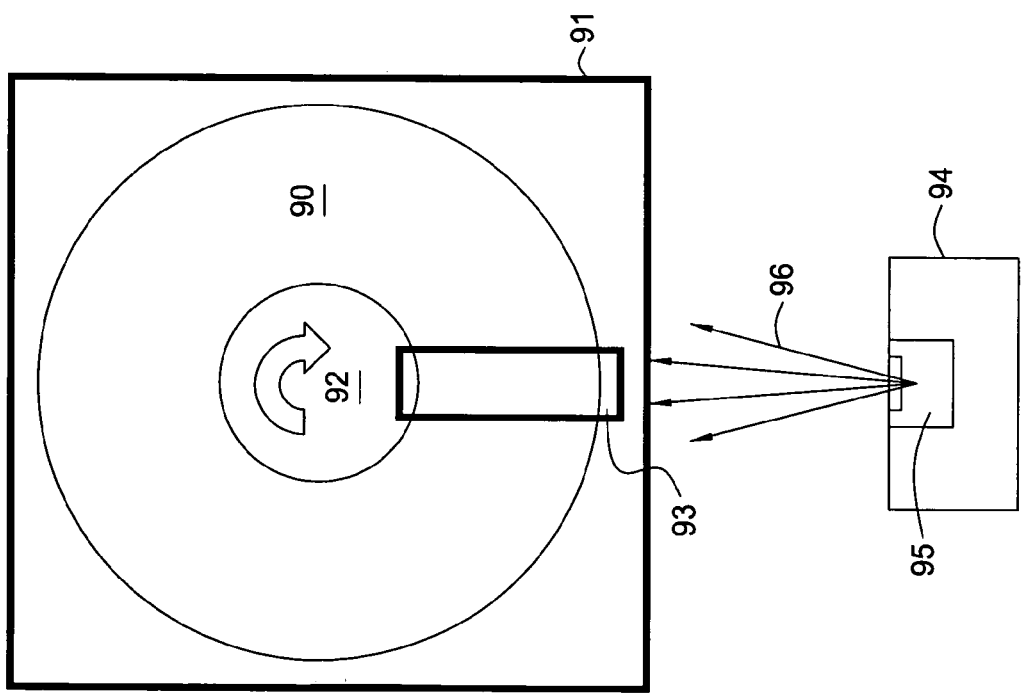

In another embodiment of the invention illustrated in FIGS. 9A to 10B, apparatuses are utilized for oblique incidence evaporation of materials with suitable apertures to create either radial or circumferential tilt growth symmetry. Materials suited for evaporation methods include Ag, Ru, Co—Cr, Ru—Cr, Ni—Fe and other materials used to deposit template layer. Generally, the evaporation methods operate under a low vacuum (about $10^{-5}$ Torr) and at or near the melting temperature of the material to be deposited. The evaporation methods form angles of incidence, referenced relative to the plane of disks, in the range from about 30° and about 60°, preferably from about 40° to about 60°. FIGS. 9A (top view) and 9B (side view) illustrate oblique incidence evaporation for radial tilt growth symmetry, single-sided deposition. FIG. 9 shows disk 90 on rotatable disk support 92. The evaporation capsule 94 with orifice 95 emits deposition material at various trajectories 96 including perpendicular and non-perpendicular angles with respect to the disk 90. Evaporated material with selected trajectories travel through collimator 97. A shutter plate 91 further restricts transmission of a portion of the evaporated material via an aperture 93. The aperture 93 is in fluid communication from the orifice 95 to the surface of disk 90. This process requires rotation of the disk substrate for circumferential uniformity. The relative placement of the evaporation capsule 94 and the aperture 93 to the disk 90 controls the tilt angle and symmetry, i.e., radial.

FIGS. 10A (top view) and 10B (side view) illustrate oblique incidence evaporation for circumferential tilt growth symmetry, single-sided deposition. FIG. 10 shows disk 100 on rotatable disk support 102. The evaporation capsule 104 with orifice 105 emits deposition material at various trajectories 106 including perpendicular and non-perpendicular angles with respect to the disk 100. Evaporated material with selected trajectory travels through collimator 107. A shutter plate 101 further restricts transmission of a portion of the evaporated material via an aperture 103. The aperture 103 is in fluid communication from the orifice 105 to the surface of disk 100. The relative placement of the evaporation capsule 104 and the aperture 103 to the disk 100 controls the tilt angle and symmetry, i.e., circumferential.

As illustrated, the apparatus of FIGS. 9 and 10 are suitable for single-sided deposition. It should be apparent, however, that that double-sided single or multiple disk deposition can be accomplished using a multiplicity of evaporation sources and apertures and a disk holders similar to that of FIG. 6A.

While the foregoing is directed to embodiments of the invention, other and further embodiments of the invention may be devised without departing from the basic scope thereof, and the scope thereof is determined by the claims that follow.

What is claimed is:

1. A magnetic media supported on a substrate, comprising:
    a template layer comprising an amorphous layer and a crystalline layer; and
    a magnetic alloy layer formed on to the template layer, the magnetic alloy layer having an easy axis with a tilt angle in a range from about 40° to about 50° relative to a surface of the substrate, wherein the template layer has a tilt angle in a range from about 40° to about 50° relative to the surface of the substrate.

2. The magnetic media of claim 1, wherein the magnetic alloy layer has a thickness in a range from about 100 Å to about 400 Å.

3. The magnetic media of claim 2, wherein the magnetic alloy layer includes a material selected from the group consisting of cobalt, cobalt alloys, Co—Pt, Co—Cr, Co—Pt—Cr, Co—Ta, Co—Pt+$O_2$ and Co—Pt+$SiO_2$ and combinations thereof.

4. The magnetic media of claim 1, wherein a noble metal layer is disposed between the amorphous layer and the crystalline layer.

5. The magnetic media of claim 4, wherein the noble metal layer includes silver.

6. The magnetic media of claim 5, wherein the noble metal layer has a thickness in a range from about 5 Å to about 200 Å.

7. The magnetic media of claim 1, wherein the amorphous layer has a thickness in a range from about 500 Å to about 1,000 Å.

8. The magnetic media of claim 1, wherein the crystalline layer has a thickness in a range from about 50 Å to about 300 Å.

9. The magnetic media of claim 1, wherein the crystalline layer includes a material selected from the group consisting of cobalt, cobalt alloys, Co—Pt, Co—Cr, Co—Pt—Cr, Co—Ta, Co—Pt+$O_2$ and Co—Pt+$SiO_2$ and combinations thereof.

10. A magnetic media supported on a substrate, comprising:
    a template layer comprising an amorphous layer and a crystalline layer; and
    a magnetic alloy layer formed on to the template layer, the magnetic alloy layer having an easy axis with a tilt angle in a range from about 40° to about 50° relative to a surface of the substrate, wherein the amorphous layer includes a material selected from the group consisting of Fe—Co—B alloy, Fe, Fe-alloys, Co, Co-alloys and combinations thereof.

11. The magnetic media of claim 10, wherein the magnetic alloy layer includes a material selected from the group consisting of cobalt, cobalt alloys, Co—Pt, Co—Cr, Co—Pt—Cr, Co—Ta, Co—Pt+$O_2$ and Co—Pt+$SiO_2$ and combinations thereof.

12. The magnetic media of claim 10, wherein a noble metal layer is disposed between the amorphous layer and the crystalline layer.

13. The magnetic media of claim 10, wherein the crystalline layer has a thickness in a range from about 50 Å to about 300 Å.

14. The magnetic media of claim 10, wherein the amorphous layer has a thickness in a range from about 500 Å to about 1,000 Å.

* * * * *